United States Patent [19]

Bhargava

[11] Patent Number: 4,607,217

[45] Date of Patent: Aug. 19, 1986

[54] SUBSYNCHRONOUS RESONANCE DETECTION

[75] Inventor: Bharat Bhargava, Walnut, Calif.

[73] Assignee: Southern California Edison Company, Inc., Rosemead, Calif.

[21] Appl. No.: 536,665

[22] Filed: Sep. 28, 1983

[51] Int. Cl.[4] ............................................. G01R 23/02
[52] U.S. Cl. .................... 324/78 R; 323/210; 322/29
[58] Field of Search ............ 324/78 R, 80, 78 Z, 324/140 D, 83 R, 83 A; 322/29, 32, 58; 323/210, 361; 361/20

[56] References Cited

U.S. PATENT DOCUMENTS

| | | | |
|---|---|---|---|
| 3,610,029 | 9/1971 | Carlson | 73/61.4 |
| 3,731,527 | 5/1973 | Weaver | 73/119 A |
| 3,813,593 | 5/1974 | Tice | 361/113 |
| 3,886,449 | 5/1975 | Wolfinger | 324/142 |
| 3,944,846 | 3/1976 | Thompson | 307/129 |
| 3,999,115 | 12/1976 | South | 322/25 |
| 4,051,427 | 9/1977 | Kilgore | 73/650 |
| 4,080,559 | 3/1978 | Wright | 322/25 |
| 4,106,071 | 8/1978 | Sun | 361/79 |
| 4,125,884 | 11/1978 | Sun | 322/58 |
| 4,208,687 | 6/1980 | Sun | 340/658 |
| 4,218,718 | 8/1980 | Sun | 361/79 |
| 4,292,545 | 9/1981 | Hingorani | 323/210 |
| 4,329,637 | 5/1982 | Kotake | 322/20 |
| 4,438,386 | 3/1984 | Gyugyi | 322/32 |

Primary Examiner—Michael J. Tokar
Attorney, Agent, or Firm—Lyon & Lyon

[57] ABSTRACT

Subsynchronous resonance is detected in an electric a.c. power supply system by determining changes in wave parameters of substantially successive half cycles and applying said changes as a relationship of said subsynchronous resonance. The parameter change measured is the wave period, and changes in the ratio of the difference of the period of positive and period of negative half cycles over the sum of the period positive and the period of negative half cycles is related to detection of subsynchronous resonance.

16 Claims, 3 Drawing Figures

SUBSYNCHRONOUS RESONANCE DETECTION

BACKGROUND OF THE INVENTION

This invention relates to subsynchronous resonance detection in A.C. power supply systems.

Subsynchronous resonance is a phenomenon in electrical power systems in which electrical frequencies below 60 Hz, generated by series capacitors which are used for series inductance compensation, interact with natural mechanical frequencies of a generating machine. This can result in substantial torque increases on the generating machine shafts.

The large masses of the turbines and the shafts connecting the turbines which act like springs have natural mechanical frequencies, some of which are below 60 Hz. Likewise, series capacitors in the electrical system also form electrical tuned frequencies, some of which are below 60 Hz. When transformed onto the rotor side these electrical frequencies are reflected as a different frequency. The reflected frequency can result in an unstable electro-mechanical system if it coincides with the mechanical frequency of the machine.

This unstable electro-mechanical system can be disturbed by an exciting force or a system transient which may be periodic or an impulse and can set up oscillations. Although there is generally some damping available in the electro-mechanical system, it is generally quite low and can easily be overcome by the exciting force which can set up growing oscillations. The growth of oscillations can continue to the point that the shafts become twisted and damaged.

This phenomena, known as subsynchronous resonance, occurs because of interchange and oscillation of energy between the electrical and mechanical systems, the energy being alternatively stored in series capacitors and in the various shaft sections of the generating machine.

The energy oscillations between the electrical and mechanical systems effectively modulate the normal 60 Hz voltage wave through which the power flows from the generating machine to the electrical system.

The modulation of the 60 Hz voltage is complex in nature, because the mechanism inherent in the generating machine effects modulation both in amplitude and in frequency since the amplitude of the voltage wave is a function of frequency. Furthermore, under certain conditions of subsynchronous resonance the effect is such that energy interchange reinforces the oscillations positively and the energy interchange keeps on increasing with larger energy being diverted into this oscillating system.

Prior art techniques for detecting such resonance have included filter systems to filter out normal power frequency components and thereafter treating the subsynchronous signal. Alternatively, detection is effected by sensing shaft rotation. This sensing of subsynchronous resonance by this invention is effected by an entirely different technique.

SUMMARY OF INVENTION

Modulation of the 60 Hz voltage wave by subsynchronous current creates short and long half cycles in the voltage wave both in amplitude and frequency. The short half cycles represent flow of subsynchronous energy in one direction, that is from the series capacitors to the generating machine, while the long half cycles flow in the other direction, namely from the machine to the series capacitors.

Detection of slow growing subsynchronous resonance is affected by measuring the half wave periods with zero crossings of the 60 Hz voltage or current waves. It is possible to detect subsynchronous currents from the line voltage near the machine, but because the electrical characteristics of the series capacitors are such that it offers higher impedance to the low frequency currents, the subsynchronous resonance effect is amplified and can be detected easily from the voltage across the series capacitors. Subsynchronous current flowing through the series capacitors result in larger variations in the voltage half waves.

The invention uses the characteristics that subsynchronous frequency in the line current creates longer half cycles and shorter half cycles. The change in the half cycle time depends on the percent modulation or the percent of the subsynchronous current present in the 60 Hz wave on the frequency of the subsynchronous current. The difference of the half cycle periods is measured successively to provide a method of detecting the presence of subsynchronous current which is modulating the 60 Hz voltage and current waves.

Detecting subsynchronous resonance comprises determining changes in a wave parameter of substantially successive half cycles of said a.c. power supply. These changes are applied as a relationship of said subsynchronous resonance. The parameter is, preferably the period of successive half cycles.

DESCRIPTION OF THE PREFERRED EMBODIMENT

Figure 1:
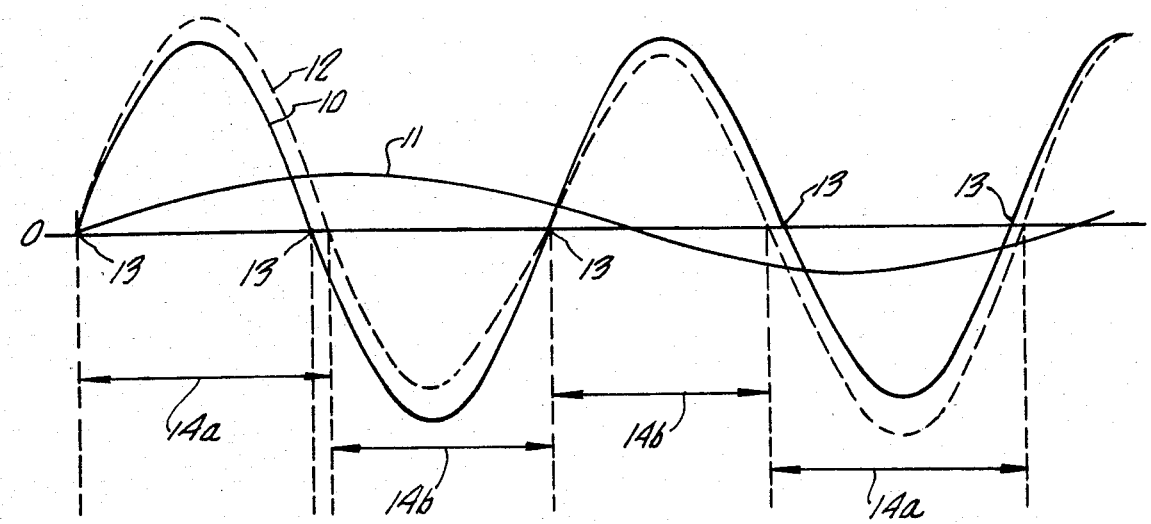
FIG. 1 is a graphical representation showing an a.c. power system voltage, subsynchronous voltage and effect of this subsynchronous voltage on the a.c. voltage.

In FIG. 1 the wave form 10 represents the 60 Hz voltage generated by a generator of an a.c. power system. Also generated by the interaction between electro mechanical system of the generator is a subsynchronous voltage illustrated by wave form 11. The combination effect of the generated voltage in a subsynchronous voltage 11 is illustrated by wave form 12. The period of each half cycle of the generated voltage is equal as indicated between points 13 which are the cross over points of the generated voltage on the zero line. Recombined subsynchronous voltage is illustrated to have different periods, namely at the points of cross over with the zero line. The arrows 14a depict the greater period, and the arrows 14b the lesser period relative to the generated voltage having a period between points 13. The greater period is created when in each half cycle the voltage wave 10 is in the same phase as the subsynchronous voltage wave 11 and contrarily the period is less where the cumulative effect of the voltage wave 10 and subsynchronous voltage wave 11 is counterphase for a particular half cycle.

Figure 2:
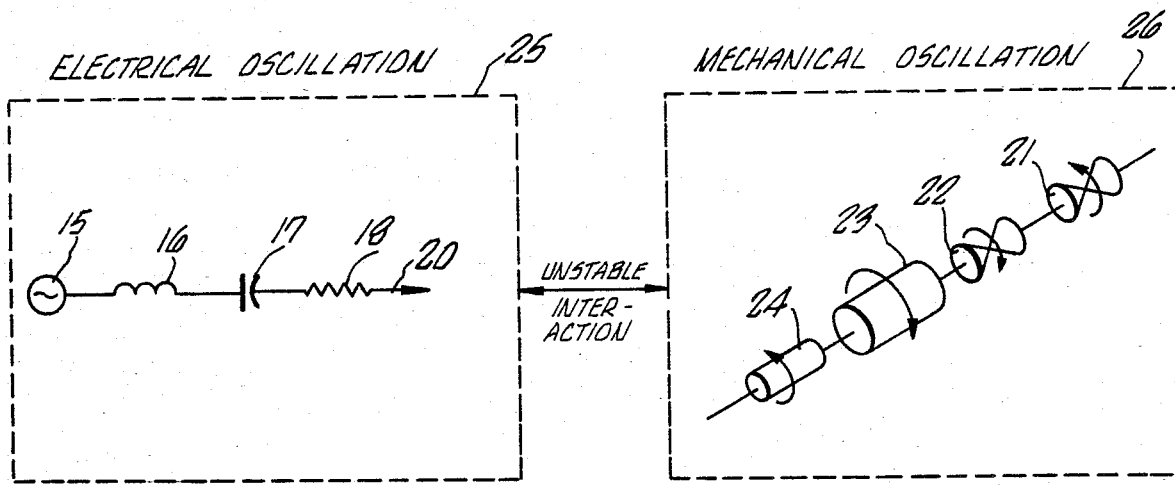
FIG. 2 is a diagrammatic illustration showing subsynchronous resonance of currents causing the unstable interaction between electrical oscillation and mechanical oscillation of an electro mechanical system.
Figure 3:
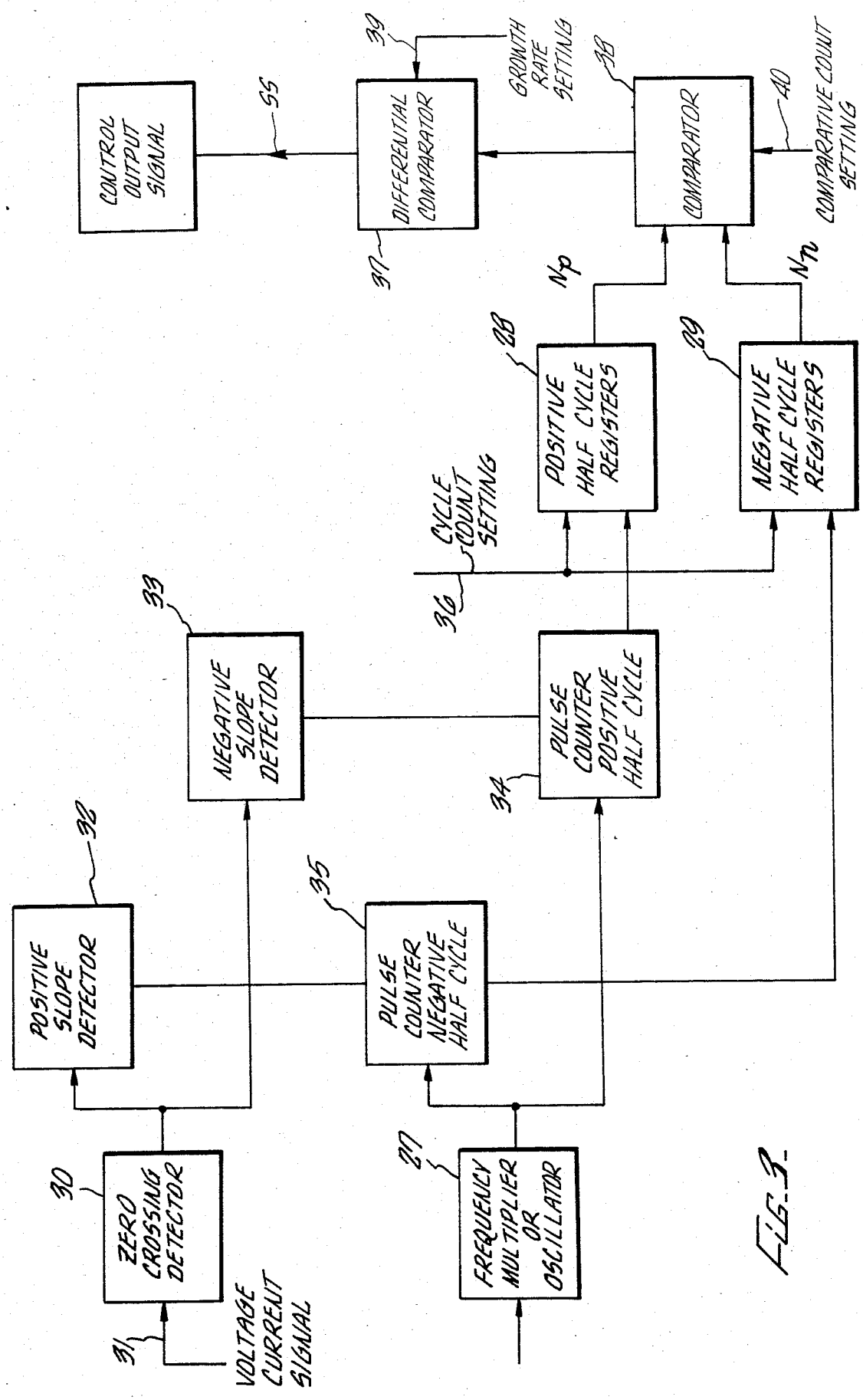
FIG. 3 is a block diagram schematic showing the applied circuitry for detecting subsynchronous resonance.

In FIG. 2 the electrical oscillation is set up between a first set of generators 15 which is connected through inductive reactance of the line and system 16, series capacitors 17 and resistance 18 of the line system connected through line 20 to a second set of generators. This relates to the turbine generator rotating shaft system of the second set of generators which is illustrated with an hp turbine 21 connected with an ip turbine 22 in turn connected to a generator rotor 23 and exciter 24. The torque effect of the electrical system 25 is applied to the mechanical system 26 through the generator rotor at 23 as indicated in FIG. 2. The critical tuning of the capacitors 17 with the line, generator and system inductance 16 can result in an electrical frequency being complementary to the mechanical frequency setting up the undesirable subsynchronous resonance.

With the 60 Hz voltage waves depicted by wave form 10 the voltage half cycles are equal and are precisely of $1000/60 = 8.33$ milliseconds duration between cross over points 13. The combination subsynchronous voltage produces longer half cycles and shorter half cycles as indicated.

Time measurement of the 60 Hz half cycle of wave form 12 is effected by an oscillator or frequency multiplier 27 with a high frequency, several thousand times that of the 60 Hz wave. Thereafter the number of oscillator frequency cycles which elapse in each positive and each negative half cycles is respectfully counted. The positive and negative half cycle counts of this oscillator frequency are stored in separate registers 28 and 29. The registers 28 and 29 generate respectively Np and Nn values.

The system also includes a zero crossing detector 30 which receives an input voltage/current signal 31. From detector 30 the signal feeds to a positive slope detector 32 and negative slope detector 33 which respectively trigger the operation of a pulse counter for the positive half cycle 34 and a pulse counter for the negative half cycle 35. Setting of the registers 28 and 29 for each count can be effected by a signal 36.

The ratio of the difference in the positive and negative counts to the number of counts of the sum of the two half cycles is obtained from a differential comparator 37 and comparator 38 which in turn generates a value SS. A growth rate setting signal 39 can be fed to differential comparator 37 and a comparison count setting signal 40 to the comparator 38.

The value SS is calculated for each set of positive and negative half cycles. The SS number is positive if the positive half cycle exceeds the negative half cycle count and negative if the negative half cycle exceeds the positive half cycle count. The difference of counts, or the SS number in two half cycles and summed over a few 60 Hz cycles in the separate positive and negative registers 28 and 29 thus provides a detection of subsynchronous current.

Subsynchronous current can be detected in one or more cycles. The accuracy is improved, however as larger numbers of cycles are averaged.

The following tables illustrate the relationship reflected in the changes in the wave parameter of 60 Hz half cycles; wherein $$SS = \frac{Np - Nn}{Np + Nn} :$$

TABLE I

| | | | Steady oscillation - no growth. | | | | |
|---|---|---|---|---|---|---|---|
| | | | Counter I (Pos. Higher) | Counter II (Neg. Higher) | SS* | | Rate of growth of SS |
| Total | Np + Nn | Np − Nn | 28 | 29 | + | 0 | SS/−cycle |
| 300 | | 100 − 200 | | −100 | | 0.1667− | |
| | 600 | | | | | | |
| 300 | | 200 − 100 | 100 | | +0.1667 | | |
| 300 | | 100 − 200 | | −100 | | 0.1667− | 0    0 |
| | 600 | | | | | | |
| 300 | | 200 − 100 | 100 | | +0.1667 | | |

SS 100/600 = 0.167 is constant but is alternatively negative and positive. SS is constant in magnitude indicating neither growth nor decay.

TABLE II

| | | | Steady growing oscillations. | | | | |
|---|---|---|---|---|---|---|---|
| | | | Counter I (Pos. Higher) | Counter II (Neg. Higher) | SS* | | Rate of growth of SS |
| Total | Np + Nn | Np − Nn | 28 | 29 | + | 0 | SS/−cycle |
| 300 | | 100 − 200 | | 100 | | −0.167 | |
| | 600 | | | | | | |
| 300 | | 210 − 90 | 120 | | +0.2 | | |
| 300 | | 80 − 220 | | 140 | | −0.233 | .0667   .0667 |
| | 600 | | | | | | |
| 300 | | 230  70 | 160 | | +0.2667 | | |

SS is increasing and is alternatively negative and positive. Rate of growth of SS will indicate how soon action will have to be taken.

The subsynchronous currents generated in electrical systems arise for several reasons. Thus, before remedial action is undertaken it is necessary that the hazardous conditions be discriminated correctly from normal operating conditions and changes. What is hazardous to the generating machines are basically the growing subsynchronous oscillation due to subsynchronous resonance. The growing oscillations is indicated as alternately increasing differences in the positive and negative half cycles. The cycle counts if calculated for several cycles and measured successively several times show increasing counts of SS for growing oscillations. Cycle counts where SS is decreasing shows a decaying difference, namely decaying subsynchronous oscillations.

The decaying difference in counts of SS may not require any remedial action. The increasing counts of SS indicate growing oscillation and the need for remedial measures. The rate of growth of SS identifies how soon that action is needed. The rate of growth is calculated from the cycle counts using available electronic hardware.

The application of this invention differentiates between subsynchronous currents and dc offsets. The dc offsets generally occur in an electrical system whenever the system configuration is switched or a fault occurs. The dc offsets in the electrical systems are unidirectional, namely, all the positive half cycles either increase and the negative half cycles decrease or vice versa. The dc offsets generally decay out gradually, and the difference in positive half cycle and negative half cycle decreases in a decaying dc offset uniformly and have the same sign. Thus, SS will be either always positive or negative. This is shown in the following table:

By the invention, the parameters of successive half waves is measured to obtain a reflection of the existence of subsynchronous resonance. The parameter described in detail is the period of the wave. Alternatively it may be the amplitude of the wave of each half cycle or some other suitable wave change characteristic.

In essence the invention relates to detecting non-unidirectional changes in successive positive half waves or successive negative half waves respectively, and relating these non-unidirectional changes to an indication of subsynchronous resonance.

As a preferred embodiment of the present invention has been described and illustrated in detail, those skilled in the art already appreciate various modifications can be made without departing from the spirit of the present invention. Accordingly, the scope of the invention is to be limited only by the appended claims.

I claim:

TABLE II

| Total | Np + Nn | Np − Nn | DC Offset Counter I (Pos. Higher) 28 | DC Offset Counter II (Neg. Higher) 29 | SS* + | | Rate of growth of SS SS/−cycle |
|---|---|---|---|---|---|---|---|
| 300 | | 180 120 | 60 | — | +0.2 | — | |
| | 600 | | | | | | |
| 300 | | 160 140 | 20 | −20 | +0.066 | — | −1.33 |
| 300 | | 150 150 | — | −10 | +— | — | |
| 600 | | | | | | | |
| 300 | | 150 150 | — | — | | | |

SS is positive and is decreasing. There is no negative SS.

The measurement of voltage for determining the zero crossing can be done across series capacitors 17 which provides an efficient method for detection of subsynchronous resonance. The series capacitors 17 however may be located at a remote location from the generators 20 requiring protection. Moreover there may be multiple transmission lines which may contribute to subsynchronous resonance. In the case of such multiple transmission lines, though the effect of subsynchronous current measured at each capacitor location may not indicate severity, the effect of the combined transmission system may be hazardous to the machines. Remote location of series capacitors 17 may require a telemetering signal to the generating station to prevent subsynchronous resonance and/or to initiate remedial action. In such case the subsynchronous detecting device can be installed at the generating station and the machine or bus bar voltage measured and used as a signal for subsynchronous resonance detection.

Relatively extreme low frequency subsynchronous currents (1–10 Hz electrical) or system swings can modulate the 60 Hz voltage waves such that reversal of SS may not occur for several cycles and should the detecting device be set to count the number of cycles less than this, the modulation may appear to be like a dc offset. It may therefore be necessary to wait for sufficient cycles before preventive action is undertaken. These low frequency swings generally do not require a prompt action. When integrated over a sufficient number of cycles the device could detect a system swing condition and be used to indicate dynamic instability growth just like subsynchronous resonance conditions.

Remedial circuitry elements which may be added to the system to overcome the subsynchronous resonance can be resistors or capacitors. The frequency of the high frequency oscillator can be in the range of 100 KHz to 10,000 KHz.

1. A method of detecting subsychronous resonance in an electrical a.c. power supply system comprising determining differences in a wave parameter of substantially successive positive half cycles of said a.c. power supply and substantially successive negative half cycles of said a.c. power supply, comparing the differences in the parameter of several positive half cycles and changes in the parameter of several negative half cycles, and applying such differences in a relationship to indicate the existence or otherwise of said subsynchronous resonance, wherein the parameter is the wave parameter and including respectively averaging the period of several positive half cycles and the period of several negative half cycles.

2. A method of detecting subsynchronous resonance in an electrical a.c. power supply system comprising determining changes in the period of a wave of substantially successive positive half cycles of said a.c. power supply and substantially successive negative half cycles of said a.c. power supply, comparing changes in the period of several positive half cycles and changes in the period of several negative half cycles, respectively averaging the period of several positive half cycles and the period of several negative half cycles, and calculating the ratio of the difference of the period of negative half cycles from the period of the positive half cycles over the sum of the period of the positive half cycle and the period of the negative half cycle, and representing changes in this ratio as a reflection of subsynchronous resonance.

3. A method as claimed in claim 2 wherein an increasing ratio is representative of increasing subsynchronous frequency.

4. A method as claimed in either claims 2 or 3 including generating a high frequency signal and determining the period of each half cycle by counting the number of high frequency cycles for each positive half cycle and each negative half cycle.

5. A method as claimed in claim 4, including storing counts of the high frequency signal for the positive half cycle and the high frequency signal for the negative half cycle separately, calculating the difference between the positive half cycles counts and the negative half cycle counts, calculating the sum of the positive half cycle counts and negative half cycle counts, determining the ratio of the difference to the sum, wherein a positive ratio increase indicates a positive half cycle period increase, a negative ratio increase indicates an increase in the period of the negative half cycle, and calculating the rate of growth of such ratio, such growth rate reflecting the growth of subsynchronous frequency.

6. A method as claimed in claim 1, wherein the parameter is the wave amplitude.

7. A method of remedying the occurrence of subsynchronous resonance in an electrical a.c. power supply system comprising determining changes in a wave parameter of substantially successive positive half cycles of said a.c. power supply and substantially successive negative half cycles of said a.c. power supply, determining any difference between the period of successive positive half cycles and the period of successive negative half cycles applying said difference in a relationship to indicate the existence or otherwise of said subsynchronous resonance, determining the rate of growth of such subsynchronous resonance, and changing the constitution of the a.c. power supply to substantially counter the effect of such resonance.

8. A method of detecting subsynchronous resonance in an electrical a.c. power system comprising determining non-unidirectional differences in substantially successive positive half cycles respectively or negative half cycles respectively of said a.c. power supply, and applying said differences in a relationship to indicate the existence or otherwise of subsynchronous resonance.

9. A method as claimed in claim 8, wherein increases in the changes indicate subsynchronous resonance.

10. Apparatus for detecting subsynchronous resonance in an electrical a.c. power supply system comprising means for determining the difference in a wave parameter of substantially successive positive half cycles of said a.c. power supply and substantially successive negative half cycles of said a.c. power supply, and means for applying the difference in a relationship to indicate the existence or otherwise of said subsynchronous resonance.

11. Apparatus as claimed in claim 10, wherein the wave parameter is the period of the wave.

12. Apparatus as claimed in claim 11, comprising means for comparing differences in the period of several positive half cycles and differences in the period of several negative half cycles.

13. Apparatus as claimed in claim 12, including means for respectively averaging the period of several positive half cycles and several negative half cycles.

14. Apparatus for detecting subsynchronous resonance in an electrical a.c. power supply system comprising means for determining changes in the period of a wave of substantially successive positive half cycles of said a.c. power supply and substantially successive negative half cycles of said power supply, means for comparing changes in the Period of several positive half cycles and changes in the period of several negative half cycles, means for respectively averaging the period of several positive half cycles and several negative half cycles, and means for calculating the ratio of the difference of the period of negative half cycles from the period of positive half cycles over the sum of the period of the positive half cycles and the period of the negative half cycle and means for representing changes in the ratio as a reflection of subsynchronous resonance.

15. Apparatus as claimed in claim 14, including means for generating a high frequency signal and means for determining the period of each half cycle by counting the number of high frequency cycles for each positive half cycle and each negative half cycle.

16. Apparatus as claimed in claim 15, including means for storing counts of the high frequency signal for the positive half cycle and the high frequency signal for the negative half cycle separately, means for calculating the difference between the positive half cycle counts and the negative half cycle counts, means for calculating the sum of the positive half cycle counts and negative half cycle counts, means for determining the ratio of the difference to the sum, wherein a positive ratio increase indicates a positive half cycle period increase, and wherein a negative ratio increase indicates an increase in the period of the negative cycle, and means for calculating the rate of growth of such ratio, such growth rate reflecting the growth of subsynchronous frequency.

* * * * *